United States Patent [19]

Miller

[11] 4,092,522

[45] May 30, 1978

[54] 5-BIT COUNTER/SHIFT REGISTER UTILIZING CURRENT MODE LOGIC

[75] Inventor: Homer Warner Miller, Peoria, Ariz.

[73] Assignee: Honeywell Information Systems Inc., Phoenix, Ariz.

[21] Appl. No.: 756,463

[22] Filed: Jan. 3, 1977

[51] Int. Cl.² ............................................. G06F 11/10
[52] U.S. Cl. ............................... 235/308; 235/92 EC; 364/738
[58] Field of Search ............ 235/153 AP, 92 EC, 308; 364/738

[56] References Cited

U.S. PATENT DOCUMENTS

| | | | |
|---|---|---|---|
| 3,555,255 | 1/1971 | Toy | 235/153 AP |
| 3,567,916 | 3/1971 | Fullton, Jr. | 235/153 AP |
| 3,699,322 | 10/1972 | Dorr | 235/153 AP |
| 3,701,892 | 10/1972 | Carter et al. | 235/153 AP |
| 3,732,407 | 5/1973 | Brewster et al. | 235/153 AP |

*Primary Examiner*—Charles E. Atkinson
*Attorney, Agent, or Firm*—Vincent B. Ingrassia; William W. Holloway, Jr.; Ronald T. Reiling

[57] ABSTRACT

A 5-bit D-type master/slave counter/shift register with buffered outputs is disclosed. The counter implements the load, count up, count down, and reset functions and also has the capability to be reconfigured into an inverting serial shift register for Non-Functional Test (NFT) techniques. In addition, the fifth bit may optionally be removed from the counter logic and used as a parity bit, although it will be necessary to use some external logic to implement this parity function.

8 Claims, 29 Drawing Figures

5-BIT COUNTER/SHIFT REGISTER UTILIZING CURRENT MODE LOGIC

CROSS REFERENCE TO RELATED APPLICATIONS

1. Current Mode Carry Look Ahead Array invented by Homer W. Miller bearing Ser. No. 562,327, filed Mar. 26, 1975, now issued as U.S. Pat. No. 3,925,652 and assigned to the same assignee as the instant invention.

2. Magnitude Comparison Circuit invented by Homer W. Miller bearing Ser. No. 562,318, filed Mar. 26, 1975, now issued as U.S. Pat. No. 3,955,177 and assigned to the same assignee as the instant invention.

3. Current Mode Arithmetic Logic Array invented by Homer W. Miller bearing Ser. No. 562,316, filed Mar. 26, 1975, now issued as U.S. Pat. No. 3,925,651 and assigned to the same assignee as the instant invention.

4. Current Mode Binary (BCD) Arithmetic Array invented by Homer W. Miller bearing Ser. No. 576,075, filed May 9, 1975, now issued as U.S. Pat. No. 3,958,112 and assigned to the same assignee as the instant invention.

5. Data Alignment Circuit invented by Darrell L. Fett bearing Ser. No. 559,115, filed Mar. 17, 1975, now issued as U.S. Pat. No. 3,967,101 and assigned to the same assignee as the instant invention.

6. Current Mode Multiple-Generating Register invented by Homer W. Miller bearing Ser. No. 756,465, filed Jan. 3, 1977, and assigned to the same assignee as the instant invention.

7. Current Mode Simultaneous Dual-Read/Single-Write Memory Device invented by Darrell L. Fett bearing Ser. No. 756,466, filed Jan. 3, 1977, and assigned to the same assignee as the instant invention.

8. Current Mode Arithmetic Logic Unit invented by Homer W. Miller bearing Ser. No. 756,458, filed Jan. 3, 1977, and assigned to the same assignee as the instant invention.

9. Current Mode Binary/Decimal Arithmetic Logic Unit invented by Homer W. Miller bearing Ser. No. 756,460, filed Jan. 3, 1977, and assigned to the same assignee as the instant invention.

10. 17-Bit Equality Comparator Utilizing Current Mode Logic invented by Homer W. Miller bearing Ser. No. 756,459, filed Jan. 3, 1977, and assigned to the same assignee as the instant invention, now abandoned.

11. 10-Bit D-Type Register Utilizing Current Mode Logic invneted by Homer W. Miller bearing Ser. No. 756,462, filed Jan. 3, 1977, and assigned to the same assignee as the instant invention.

12. J-K Flip-Flop Utilizing Current Mode Logic with Non-functional Test Capability invneted by Homer W. Miller bearing Ser. No. 756,461, filed Jan. 3, 1977, and assigned to the same assignee as the instant invention.

13. 4-Bit Counter/Shift Register Utilizing Current Mode Logic invented by Homer W. Miller bearing Ser. No. 756,463, filed Jan. 3, 1977, and assigned to the same assignee as the instant invention.

FIELD OF INVENTION

This invention relates generally to electronic logic circuitry used in digital processors and, more specifically, logic circuitry utilizing soft-saturating current mode logic (CML).

BACKGROUND OF THE INVENTION

In the evolution of digital electronic circuitry many different logic family types have been developed to increase the switching time and throughput of digital processing apparatus. These families, such as diode-transistor, resistor-transistor, and transistor-transistor ($T^2L$), etc., have been stepping stones in digital design evolution. At the present time current mode logic (CML) presents the best, economic trade-off between the cost of manufacture and design characteristics. As noted in the first five cross references to this application, the first generation of the CML logic family has been in existence for some time. The next step in the evolutionary process, of which this invention is a part, concerns improvements in the power consumption, switching speed, gate intensity, functionality, and magnitude of integration of the circuits. The development of this second generation CML logic circuitry provides for an enhanced performance of computer system and at the same time lowers the cost-performance ratio of the digital data processor.

In order that this second generation of CML devices may present the maximum throughput improvement possible it was necessary that a large selection of such circuits be available for the designer's use. To this end the applications numbered 6 through 13 in the Cross Reference to Related Application section of the instant application is a measure of the extent of development of this second generation CML circuitry.

SUMMARY OF THE INVENTION

The 5-bit D-type master/slave counter-shift edge triggered register in accordance with the instant invention includes a variety of basic CML circuits configured in such a manner as to synchronously load or reset the counter, or allow the register to operate as a count-up or count-down counter as well as providing for a parity bit for those cases where a 4-bit counter would be sufficient, the parity bit utilizing that would normally be the fifth counter bit. In addition, the five buffered outputs may be configured into a serial shift register with an inversion between each bit. This serial shift function was designed to enhance the testing capability of the individual register as well as the data processing system in general.

The device is configured such that upon the falling edge of the clock, i.e., when the clock pulse goes from a logical "0" to a logical "1" (utilizing the negative logic convention) the counter register is activated and depending upon the state of six control signal inputs will either maintain the output bits from the same state, load the preprogrammed number into the counter, count up one bit, count down one bit, reset all output state to 0 or generate the complement of the prior stages output.

Transfer of the data through the data stages of the register is accomplished via an input section followed by a master/slave latch into a buffered output. When the master/slave clock is a logical "0" the slave latch is enabled as is the data selector gate. Enabling of the data selector gate forces the data selected to appear at the output of the master latch which in effect preconditions the master latch prior to the data selector gate lockout which occurs on the falling edge of the clock. So long as the clock is in the logical "1" state, the master latch output preconditions the slave latch such that when the clock again returns to "0," the master latch is disabled and the slave latch retains the last state of the master latch until such time as the next falling edge of the clock occurs.

An additional feature of the register is its hybrid mode of operation. Input and output signals provide for a 0.5 VDC difference between a logical "0" and a logical "1," i.e., a logical "0" equals 0.0 VDC and a logical "1" equals a −0.5 VDC signal, and utilizes single-ended inputs and outputs, whereas the signals once buffered by the input section circuitry are used in a differential mode to improve the signal switching characteristics. This increase in performance is made possible by the fact that the differential mode switching occurs on only a 0.25 VDC voltage change. This decrease in the dv/dt necessary for intra-circuit communication provides for an improved switching speed characteristics while at the same time maintaining the same noise immunity generally provided by the 0.5 VDC swing of the input and output signals. With the inputs signals change 0.5 VDC in going from a "0" to a "1" or vice versa and the internal reference on the gates receiving these signals is set at a level −0.26 VDC below the logical "0," the difference in base voltage of the switching transistors is always approximately 0.26 VDC. In the instant invention the 0.26 VDC differential is maintained by eliminating the use of a reference and applying the differential voltage output of the internal logic circuits.

It is therefore an object of this invention to provide for a 5-bit D-type master/slave counter-shift edge triggered register with buffered outputs.

Another object of this invention is to implement the 5-bit D-type master/slave counter-shift edge triggered register in CML logic.

It is still another object of the instant invention to provide for a programmable, resettable count-up or count-down counter.

Yet another object of the instant invention is to provide for maximum switching characteristics without degrading other circuit parameter using internal circuit outputs in a differential mode.

It is a still further object of the instant invention to provide for nonfunctional testing of the counter.

These and other features of the instant invention will be more fully understood from the following detailed description and appended claims when taken in conjunction with the attached drawings.

DESCRIPTION OF THE PREFERRED EMBODIMENT

In reading the following description of the preferred embodiment it is important to note that the instant invention utilizes a negative logic convention, i.e., a logical "0" represented by a more positive DC voltage than a logical "1." It is also important to note the hybrid nature of the circuits used in the instant invention. Whereas all inputs and outputs from external sources utilize 0.0 VDC as a logical "0" and −0.5 VDC as a logical "1" much of the internal circuitry utilizes the differential mode of operation, wherein a logical "1" or "0" is represented by differential voltage between two points of 0.25 VDC. The polarity of that differential voltage indicating whether or not a logical "0" or a logical "1" is being transmitted from the signal source. Keeping this in mind the basic circuit building blocks shown in FIGS. 5 through 15 will now be described so as to facilitate understanding of the overall counter/register schematic shown in FIGS. 1A through 1D.

Figure 5A:
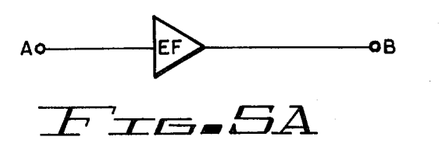
FIGS. 5 through 15 are the schematic representations of their electrical equivalency of the basic building blocks utilized in the instant invention.
Figure 5B:
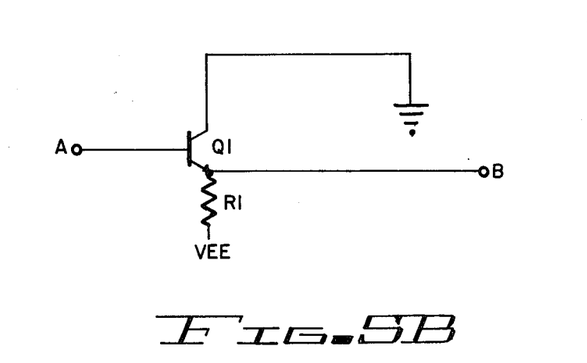

The emitter follower of FIGS. 5A and 5B permit buffering of circuit outputs as well as providing for voltage translation of approximately 0.8 VDC. An additional benefit to be derived from the emitter follower is that common outputs from the various emitter follower may be wired AND'ed and thereby eliminating the need for additional logic circuitry. In operation a logical "0" input at point A turns transistor Q1 on hard and provides a current path to ground through R1 from VEE such that the output voltage at point B will then be approximately −0.8 VDC for a logical "0." With a logical "1" at A, transistor Q1, though still conducting, presents a greater resistance to current flow causing the logical "1" output at B to be −1.3 VDC.

Figure 6A:
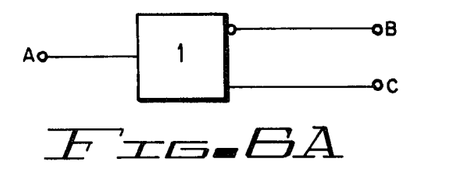
Figure 6B:
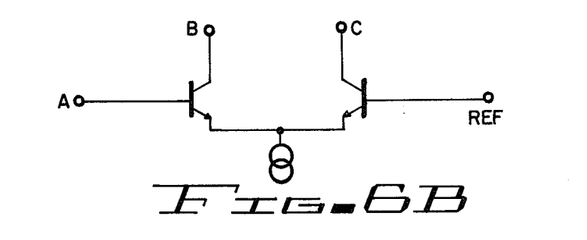

FIGS. 6A and 6B represent a typical lower level gate that is not driven differentially. Input A is driven from the output of an emitter follower so that a logical "0" is represented by a −0.8 VDC level signal and a logical "1" by a −1.3 VDC signal. When the A input is a logical "1," transistor Q2, whose base is driven by a reference voltage of approximately −1.05 VDC, is turned on and a current source is provided via output C. When the A input is a logical "0," transistor Q1 is forward biased and it provides a current source via output B. Only one of the two outputs may provide a current source at any one time, however, at least one of the two outputs is always active.

Figures 7A, 7B:
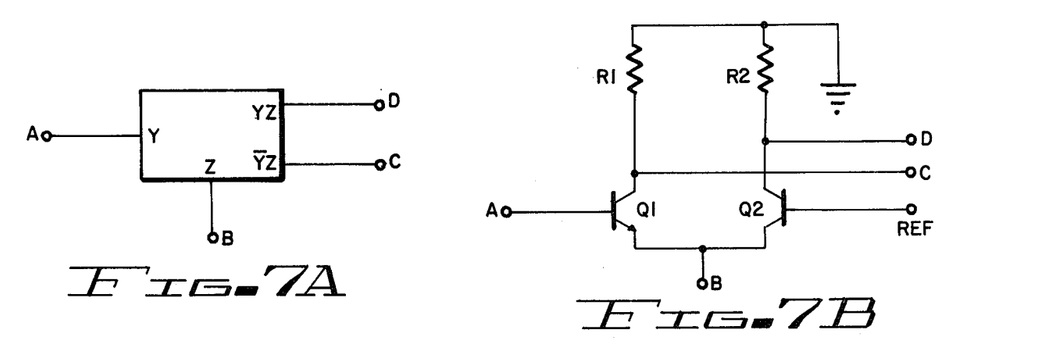

FIGS. 7A and 7B are the schematic and electrical diagrams of a single input upper level gate. A is the signal input and B is connected to a current source such as that provided from the outputs of FIG. 6. Outputs C and D are the logical output and its complement of input A AND'ed with current source at input B. In this instance the device is operable only when an active current source is applied at B, since both output C and D will be logical "0's" when B is not connected to an active current source. Assuming an active current source at B output D will be a logical "1" when A is a logical "1" and output C will be a logical "0." When A is a logical "0," D will be a logical "0" and C a logical "1."

Figure 8A:
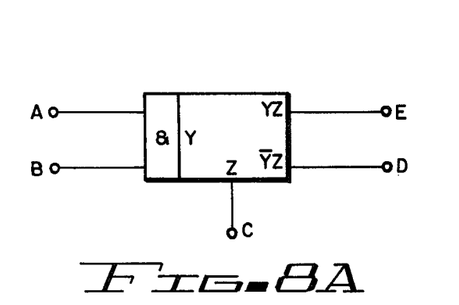
Figure 8B:
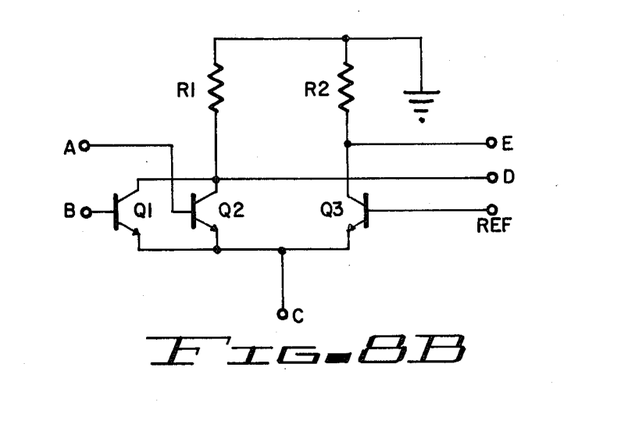

FIGS. 8A and 8B represent a two input upper level gate similar to that shown in FIG. 7 except that transistors Q1 and Q2 are connected in parallel. An active current source has to be provided at point C of FIG. 8 for anything other than a logical "0" to appear at outputs D and E. Output E will represent the logical AND'ing of inputs A and B and the current source, whereas output D indicative of complementary function A.B, concurrent with current source C.

Figures 9A, 10A:
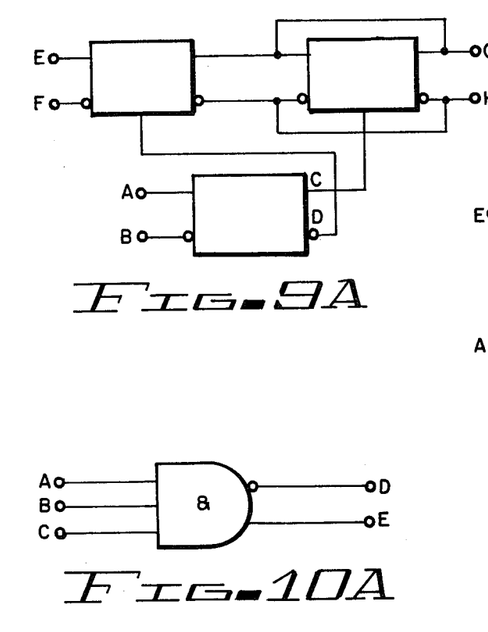
Figure 9B:
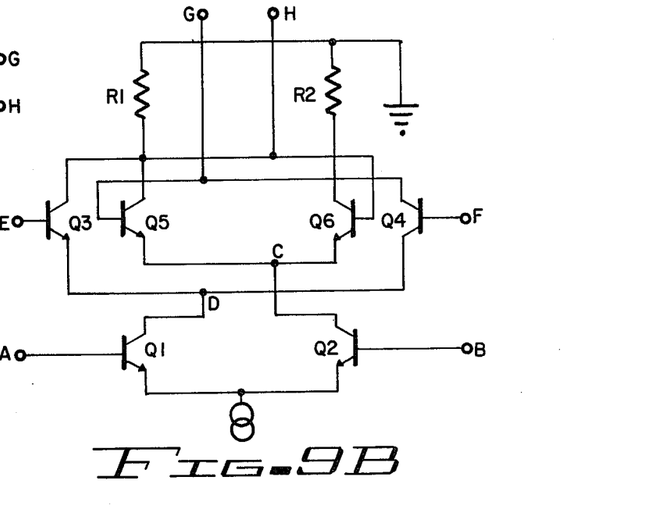

FIGS. 9A and 9B represent the master/slave latch arrangement utilized in the instant invention. While a detailed description of the operation of the two different circuit types is given in the description of FIGS. 13 and 14, it should be noted that in this configuration the circuit types are slightly modified, i.e., whereas normally both differential upper level gates would have individual output resistors, it is shown in FIG. 9B that resistors R1 and R2 are shared by both differential upper level gates. This modification is necessary any time outputs of two different gates are wired OR'ed together. Were it not for the sharing of one common resistor the output resistor of each gate would be tied in parallel with the output resistor of the other circuits causing an effective resistance less than that necessary to develop the proper voltages. In operation the voltage differential between inputs A and B will cause either transistor Q1 or Q2 to conduct. When the voltage potential at A is positive with respect to B, Q1 will attempt to conduct and if input E is positive with respect to F Q3 will also conduct providing a current source through Q1, Q3 and R1 which induces a negative voltage at H. The potential at G will be 0.0 VDC since there is no current path to the current source, transistors Q2, Q4, Q5 and Q6 being in a nonconducting state. If, on the other hand, B is positive with respect to A, Q2 will conduct permitting C to become a current source and allowing either Q5 or Q6 to conduct depending upon the previous voltages at inputs G and H. If G was positive with respect to H, Q5 will conduct and Q6 will be turned off with current flowing from the current source through transistors Q2 and Q5 to R1, thereby producing a negative voltage at H; G would remain at 0.0 VDC since no current will flow through resistor R2. The circuit is set up such that when switching occurs between transistors Q1 and Q2 the voltages previously impressed at G and H will be present at the base of their respective transistors, Q5 and Q6 until such time as one or the other has had an opportunity to turn on through the current source provided by either Q1 or Q2, even though there is, in fact, a momentary transient when transistor Q1 turns off and Q2 conducts or vice versa.

Figure 10B:
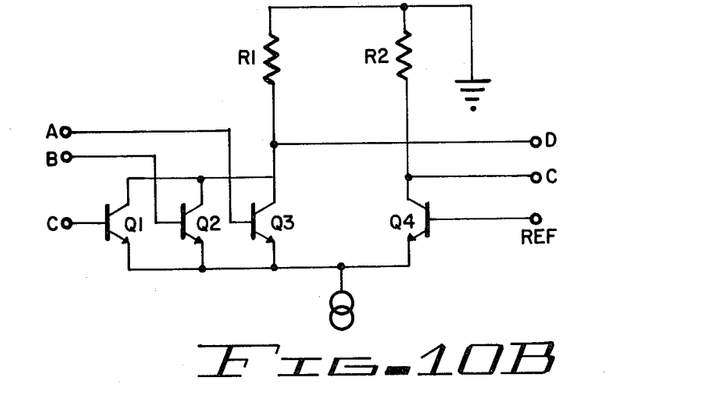

FIGS. 10A and 10B are diagrams of a three input AND gate that operates on single-ended inputs wherein a logical "0" is 0.0 VDC and a logical "1" is −0.5 VDC. As shown in FIG. 7B, a logical "0" input at either A, B, or C will cause either transistor Q3, Q2 or Q1 to conduct to provide a current path from the current source through that transistor and R1 to ground causing a logical "1" output at D. Transistor Q4, whose base will be at a lower level potential than the voltage used to represent a logical "0" will be nonconducting and a logical "0" output will appear at E. When inputs A, B, and C are logical "1's", neither transistor Q1, Q2, or Q3 will conduct, but Q4, its base now more positive than the bases of transistors Q1 through Q3 will conduct with a logical "0" output appearing at D, and a logical "1" output at E.

Figure 11A:
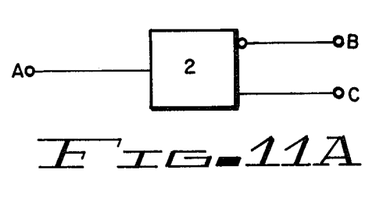
Figure 11B:
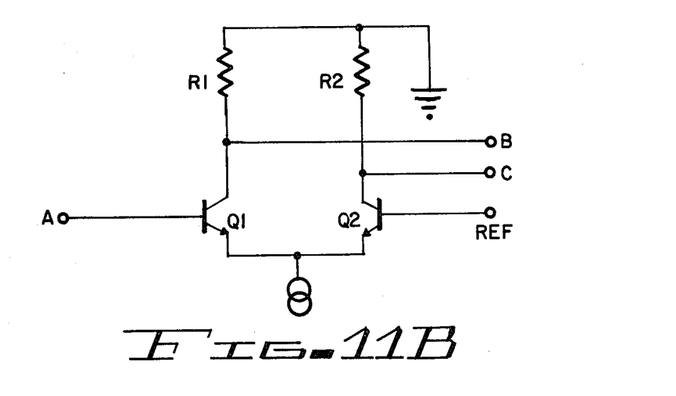

FIGS. 11A and 11B represent a true complement gate that acts as a buffer for input signal A as well as providing for its complementary output. In this case, when A is a logical "0," (0.0 VDC) transistor Q1 will conduct and a logical "1" will appear at output B, whereas transistor Q3, being in a nonconducting state will cause a logical "0" to appear at C. When A is a logical "1," transistor Q1 will be nonconducting and transistor Q2 will conduct causing a logical "1" to appear at C and a logical "0" at B.

Figure 12A:
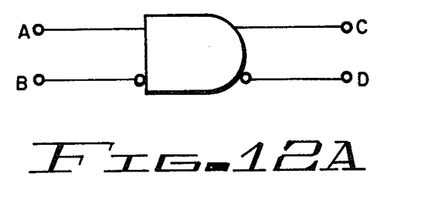
Figure 12B:
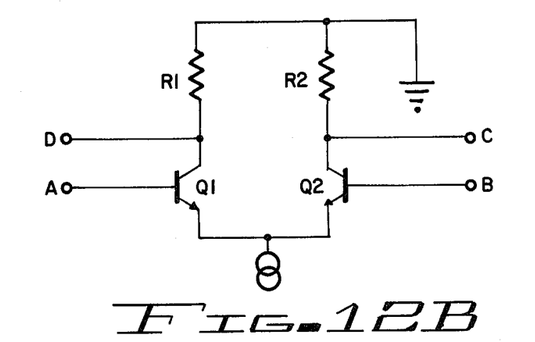

FIGS. 12A and 12B represent a differential output buffer circuit for the differential mode signal. The relative voltage between A and B cause a proportional differential voltage between output C and D, the magnitude of that output differential being controlled by the selection of resistors R1 and R2, in most cases either a −0.5 VDC or 0.0 VDC output. When A is positive with respect to B, transistor Q1 will conduct and transistor Q2 will be turned off causing a negative voltage to appear at D and a 0.0 signal at C. When B is positive with respect to A, transistor Q2 conducts, transistor Q1 is turned off, and current is supplied through transistor Q2 and resistor R2 to provide a negative voltage at C, while D is held at 0.0 VDC.

Figure 13A:
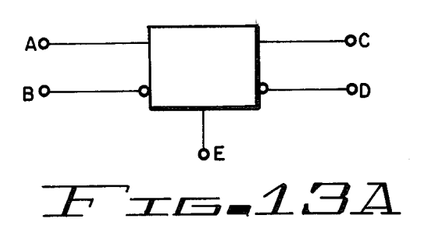
Figure 13B:
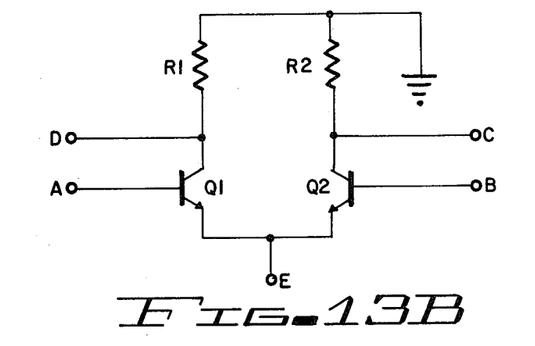

FIGS. 13A and 13B represent a differential upper level gate which is active only when an active current source is connected to input E. When so enabled, a voltage differential between A and B which is positive with respect to B will cause transistor Q1 to conduct and current to flow through Q1 and R1 forcing a negative voltage at D and a 0.0 VDC signal at C, conversely when B is positive with respect to A, transistor Q1 is turned off, transistor Q2 conducts, and current flow causes a negative voltage to appear at C and a 0.0 VDC signal at D.

Figure 14A:
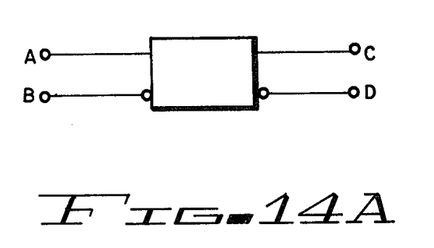
Figure 14B:
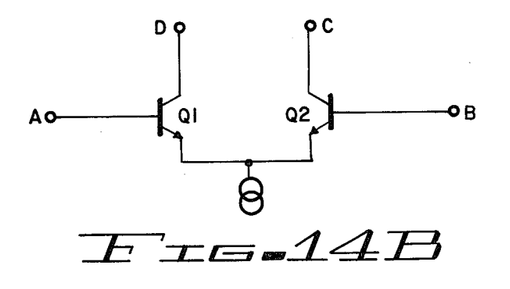

FIGS. 14A and 14B represent a differential lower level gate. Output C and D provide current sources through either transistor Q1 or Q2. When A is positive with respect to B, the D output is an active current source and output C present an open circuit condition. When B is positive with respect to A, C is an active current source and the D output represents an open circuit.

Figures 15A, 15B:
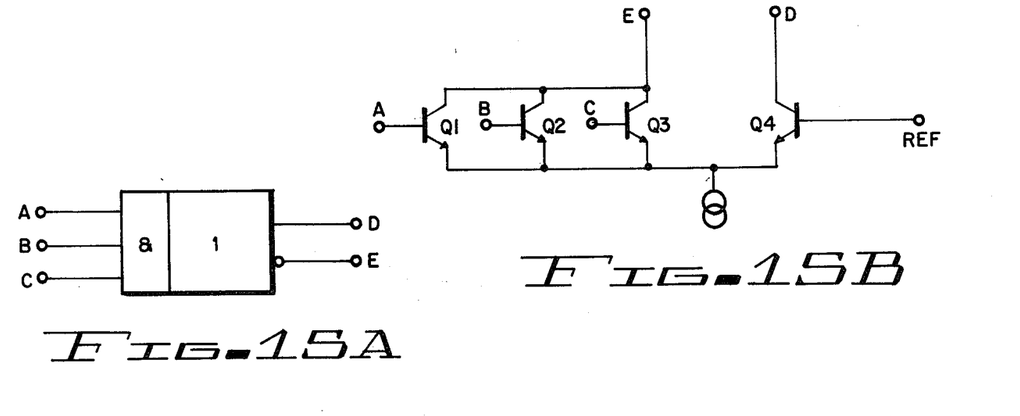

FIGS. 15A and 15B are similar to FIGS. 6A and 6B in that they are both lower level gates which provide current sources to upper level gates. However, in FIGS. 15A and B three parallel input transistors provide for an AND function to be performed prior to enabling output D. If either inputs A, B, or C is a logical "0," transistor Q4 will be turned off and output E will provide an active current source. If inputs A, B, and C are all supplied with a logical "1" input signal, transistor Q4 will conduct and provide a current source at D.

With an understanding of the basic CML building blocks discussed above the description of the invention shown in FIGS. 1A through 1D should be more readily understandable. Conceptionally, the counter can be most easily understood by dividing the unit into 8 functional blocks. These blocks would be the control unit and a clocking mechanism shown in FIG. 1A, 5 separate data stages depicted in FIGS. 1A and through 1C, each data stage composed of elements 1100 through 1125, 1200 through 1225, 1300 through 1325, 1400 through 1425 and 1500 through 1525 respectively, and a parity section shown in FIG. 1D composed of elements 1600 through 1614.

The first and fifth data stages are identical, differing only slightly from data stages 2, 3, and 4, which are also identical. The difference being that gates 1214 and 1222, 1314 and 1322, and 1414 and 1422, are two input gates, whereas the corresponding gates in the first and fifth data sections are single input gates. One other slight deviation involves the fifth data section where the output of gate 1525 is used in the parity section and to produce the $\overline{\text{NFTOUT}}$ signal rather than being used as an input to a subsequent data stage.

It will be helpful in understanding the following detailed description to refer to the following state table and list of logic equations defining the various states within the counter:

STATE TABLE

| S | $\overline{c\$}$ | LOAD | UP | DOWN | NFTR | NFTS | QS$_{2i}$ | $\overline{QS}_{2i}$ |
|---|---|---|---|---|---|---|---|---|
| ↓ | 1 | X | X | X | 0 | 0 | QS$_{2i}$ | $\overline{QS}_{2i}$ |
| ↓ | 0 | 1 | 0 | 0 | 0 | 0 | D$_{2i}$ | $\overline{D}_{2i}$ |
| ↓ | 0 | 0 | 1 | 0 | 0 | 0 | CU$_{2i}$ | $\overline{CU}_{2i}$ |
| ↓ | 0 | 0 | 0 | 1 | 0 | 0 | CD$_{2i}$ | $\overline{CD}_{2i}$ |
| ↓ | X | X | X | X | 1 | 0 | 0 | 1 |
| ↓ | X | X | X | X | X | 1 | $\overline{QS}_{2(i-1)}$ | QS$_{2(i-1)}$ | where $\overline{c\$}$ is a clock control signal, NFTR is a nonfunctional test reset signal and NFTS is a nonfunctional test shift signal.

Note that the above constitutes the only legal states, any other combinations will result in unpredictable operation.

LOGIC EQUATIONS $i = 0, 1, 2, 3, 4$ $CU_1 = CIN1 \oplus QS_1$ $CU_2 = (CIN1.QS_1) \oplus QS_2$ $CU_4 = (CIN1.QS_1.QS_2) \oplus QS_4$ $CU_8 = (CIN1.QS_1.QS_2.QS_4) \oplus QS_8$ $CU_{16} = [(CIN1.QS_1.QS_2.QS_4.QS_8.\overline{PAR}) + (PCU.PAR)] \oplus QS_{16}$ $COUT = (CIN2.QS_1.QS_2.QS_4.QS_8.QS_{16}.\overline{PAR}) + (CIN2.QS_1.QS_2.QS_4.QS_8.PAR)$ $CD_1 = BIN1 \oplus QS_1$ $CD_2 = (BIN1.\overline{QS}_1) \oplus QS_2$ $CD_4 = (BIN1.\overline{QS}_1.\overline{QS}_2) \oplus QS_4$ $CD_8 = (BIN1.\overline{QS}_1.\overline{QS}_2.\overline{QS}_4) \oplus QS_8$ $CD_{16} = [(BIN1.\overline{QS}_1.\overline{QS}_2.\overline{QS}_4.\overline{QS}_8.\overline{PAR}) + (PCD.PAR)] \oplus QS_{16}$ $BOUT = (BIN2.\overline{QS}_1.\overline{QS}_2.\overline{QS}_4.\overline{QS}_8.\overline{QS}_{16}.\overline{PAR}) + (BIN2.QS_1.QS_2.QS_4.QS_8.PAR)$ (Selector/Data)

$DS_{2i} = (D_{2i}.LOAD + CU_{2i}.UP + CD_{2i}.DOWN).(\overline{NFTR}.\overline{NFTS}) + (\overline{QS}_{2(i-1)}).NFTS$ (Master Data)

$QM_{2i} = \$.OM\overline{c\$}_{2i} + (\overline{\$.QM\overline{c\$}}).DS_{2i}$ (Master/$c\$$) $QM\overline{c\$} = \$.QM\overline{c\$} + \overline{\$} (\overline{c\$} + NFTR + NFTS)$ (Slave) $QS_{2i} = (\overline{\$.QM\overline{c\$}}).QS_{2i} + \$.QM\overline{c\$}.QM_{2i}$ (Buffer) $Z_{2i} = QS_{2i}$
$\overline{NFTOUT} = \overline{QS}_{16}$

The Fifth Bit Position.

The fifth bit can be used as a data bit or a parity bit. This functionality is controlled by the PAR input.

The equations for this bit are:

$CU_{16} = QS_{16} \oplus (PCU.PAR + CIN1.QS_8.QS_4.QS_2.QS_1.\overline{PAR})$ $CD_{16} = QS_{16} \oplus (PCD.PAR + BIN1.\overline{QS}_8.\overline{QS}_4.\overline{QS}_2.\overline{QS}_1.\overline{PAR})$ where PCU, PCD are the parity change logic equations for counting up and down respectively.

From these equations, it becomes apparant that if PAR = 0, then the fifth bit acts as a data bit, and if PAR = 1, then the position acts as a parity bit.

The equations for the COUT and BOUT terms are defined as:

$COUT = CIN2.QS_8.QS_4.QS_2.QS_1.PAR + CIN2.QS_{16}.QS_8.QS_4.QS_2.QS_1.\overline{PAR}$ $BOUT = BIN2.\overline{QS}_8.\overline{QS}_4.\overline{QS}_2.\overline{QS}_1.PAR + BIN2.\overline{QS}_{16}.\overline{QS}_8.\overline{QS}_4.\overline{QS}_2.\overline{QS}_1.\overline{PAR}$ Notice the COUT, BOUT signals are driven by a second set of inputs CIN2, BIN2. This implementation was selected to allow use of Carry/Borrow Look-Ahead structures.

Parity Prediction in Counters. After Loading an n-bit counter with data and a parity bit, it is required to predict parity for the resulting count, in either the up or down modes.

In general, the equations for the parity change functions can be expressed as:

$PCU = CIN.[\overline{Z}_1 + Z_2.\overline{Z}_4 + Z_2.Z_8.\overline{Z}_{16} + \ldots$
$\quad + Z_2.Z_8 \ldots Z_{2(n-2)}]$ if n is odd
$\quad\quad Z_2.Z_8 \ldots Z_{2(n-2)}]$ if n is even $PCD = BIN.[Z_1 + \overline{Z}_2.Z_4 + \overline{Z}_2.Z_8.Z_{16} + \ldots$
$\quad + \overline{Z}_2.\overline{Z}_8 \ldots \overline{Z}_{2(n-2)}]$ if n is even
$\quad\quad \overline{Z}_2.\overline{Z}_8 \ldots \overline{Z}_{2(n-2)}]$ if n is odd For 4 and 5 bit sections, these equations reduce to:

$PCU = CIN.(\overline{Z}_1 + Z_2.\overline{Z}_4)$     4 bit $PCD = BIN.(Z_1 + \overline{Z}_2.Z_4)$     4 bit $PCU = CIN.(\overline{Z}_1 + Z_2.\overline{Z}_4 + Z_2.Z_8)$     5 bit $PCD = BIN.(Z_1 + \overline{Z}_2.Z_4 + \overline{Z}_2.Z_8)$     5 bit With the foregoing in mind each separate section of the counter will now be described.

The control section comprises the single input upper level gate 1001, mixed lower level gate 1016, and NAND gates 1003, 1004, and 1017, inverters 1002 and 1019, emitter followers 1005, 1006, 1007, 1018 and 1020 and the LOAD, NFTR, DOWN, UP, and NFTS inputs. When NFTS is a logical "1," single input upper level gate 1001 is disabled and inverter 1019 provides a logical "0" output to emitter follower 1020 that enabled the NFT portion of each of the subsequent data stages which reconfigures the counter into an inverting serial shift register. When operating in the NFT mode the $\overline{\text{NFTIN}}$ to the first data stage is transferred to the $Z_1$ output on the next falling edge of the clock, $\$$. Each data stage output is then inverted and shifted into the subsequent stage. With the complementary output of the fifth data stage appearing as the output of gate 1528 labeled $\overline{\text{NFTOUT}}$. When NFTS is a logical "0," and NFTR a logical "1," the output of inverter 1002 is a logical "0," which after being voltage translated by emitter follower 1005, causes a "0" output in each of the data stages of the next falling edge of the clock. When in both the NFTR and NFTS inputs are logical "0's," and the clock control input $¢\$$ is a logical "1," the clocking mechanism section if prevented from propagating clock pulses to the data stages. For all cases when clock control $¢\$$ is a logical "0" and NFTR and NFTS are also logical "0's," the counter is controlled by control signals LOAD, DOWN, and UP, three mutually exclusive control signals. All three operations are enabled by the $\overline{YZ}$ output of gate 1001 which is an input to NAND gates 1003, 1004 and 1017. A LOAD signal will cause a "0" output at the output of emitter follower 1006 enabling the gates in the data stages coonnecting to the data to be loaded (inputs $D_1, D_2, D_4, D_8,$ and $D_{16}$) to the master slave latch of the respective data stage. When the DOWN input is a logical "1," the output of emitter follower 1007 is a logical "0" enabling the master/slave latch to accept the $CD_{2i}$ data. A logical "1" signal causes a logical "0" output of emitter follower 1018 which enables the master/slave latch to accept the $CU_{2i}$ data input.

Figure 1A:
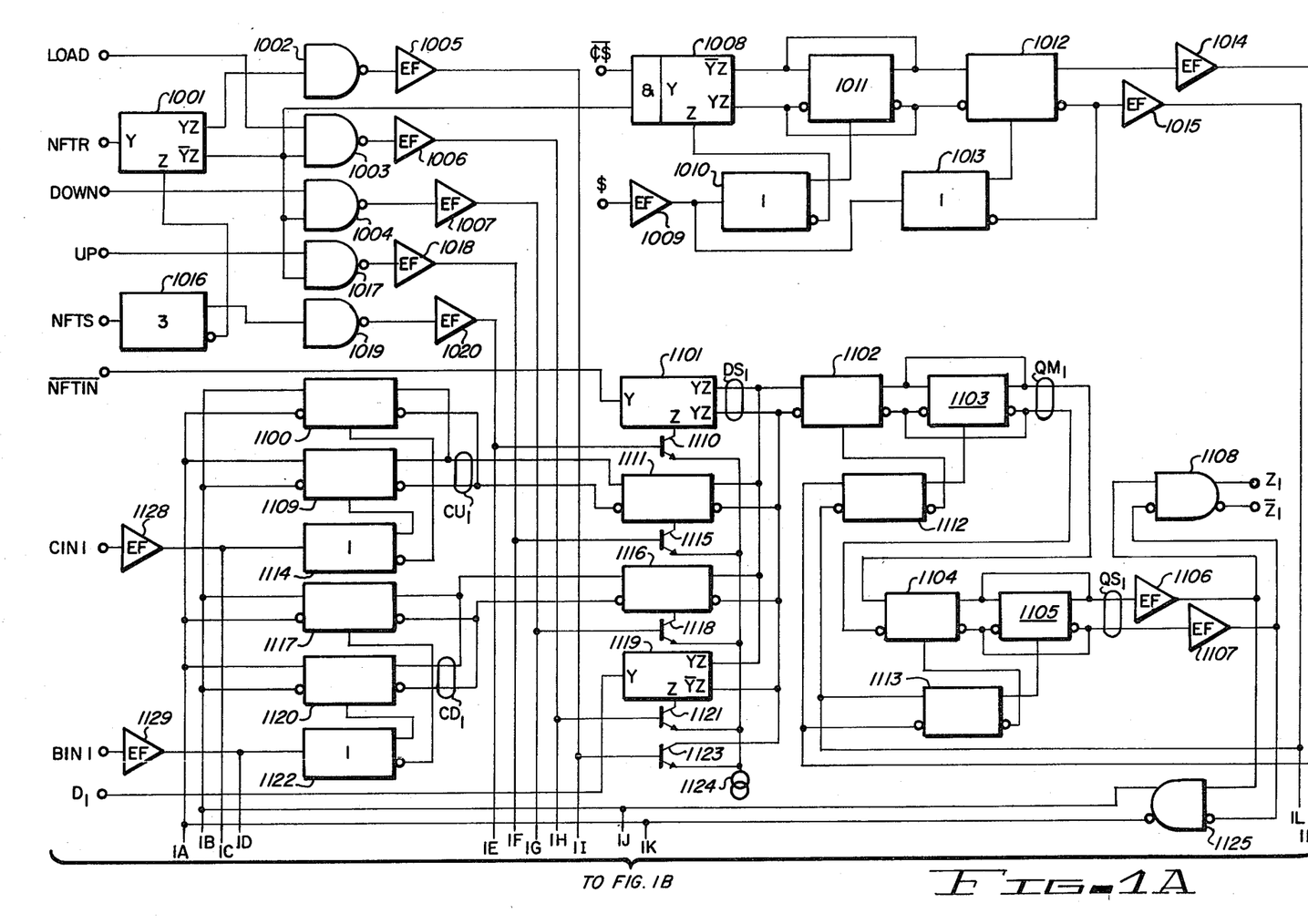
FIGS. 1A through 1D are schematic diagrams of the instant invention.

Having established the criteria for control of the counter's operation, the working's of the clocking mechanism will now be explained. As shown in FIG. 1A, two input upper level gate 1008 is enabled by the clock, $\$$, whenever the clock is a logical "0." If either of the $¢\$$ input or the $\overline{YZ}$ output of gate 1001 is a logical "0," the output of 1008 will be a logical "0," however, the output of gate 1008 is connected to the input of differential upper level gate 1011 such as to cause the complement gate 1008's output to be the input to gate 1011. So long as this is the case, the master/slave latch clock ($\$.QM¢\$$) will follow the basic clock, $\$$. When both the $¢\$$ signal and the other input to gate 1008 are logical "1's," the master/slave latch clock will not change states and no changes in the outputs of the counter will occur regardless of the number of transitions of the basic clock, $\$$.

In the following description of the operation of the data stages specific reference will be made to the $2^0$ stage of the counter, although each of the subsequent stages will operate in a like manner, even though specific data inputs to those stages shall vary depending on the output of the prior stages.

When the counter is counting in a count-up mode, transistor 1115 is forward biased and provides a current source to differential upper level gate 1111 which selects the data at $CU_1$ and presents it at $DS_1$ for entry into the master/slave latch. Either gate 1100 or 1109 will present the data at $CU_1$ depending upon the state of the CIN1 input, i.e., the initial carry in. If CIN1 is a logical "1," gate 1109 is enabled and the complement of the $Z_1$ output appears at $CU_1$. This is necessary since at the $2^0$ stage of the counter a carry input would always cause the output of that stage to toggle. If CIN1 were a logical "0" differential upper level gate 1100 will be enabled and the output at $CU_1$ would be the same as $Z_1$ output. When the counter is operating in the count-down mode, transistor 1118 conducts and provides a current source for differential upper level gate 1116 which in turn selects the $CD_1$ output and presents it to $DS_1$. The BIN1 control is implemented by lower level gate 1122 which selects the output of either differential upper level gate 1117 or 1120 for presentation of $CD_1$. Gate 1120 is enabled by a BIN1 input being a logical "1" causing the output at $CD_1$ to be the complement of the data at $QS_1$. If on the other hand control signal BIN1 is a logical "0," differential upper level gate 1117 is enabled and the complement of the data appearing at $QS_1$ is presented at $CD_1$. Operating in the LOAD mode transistor 1121 provides a current source to single input upper level gate 1119 which presents the $D_1$ for transfer into the master/slave latch. To reset the counter transistor 1123 is turned on by a logical "0" at its base which forces $DS_1$ into the logical "0" state for subsequent transfer into the master/slave latch, thereby setting the output of the data stage to "0."

To utilize the NFT capability built into the counter, transistor 1110 is made to conduct by a logical "0" level signal at its base, thereby providing a current source via current source 1124 to single input upper level gate 1101 which takes the 0.5 VDC single-ended input $\overline{\text{NFTIN}}$ and translates it into a differential logic signal at $DS_1$, for transfer into the master/slave latch. Subsequent data stages operate in a similar manner, however, in those cases the complement of the previous stages output is used as an input into a differential upper level gate which is used in place of the single-input upper level gate 1101.

Figure 1B:
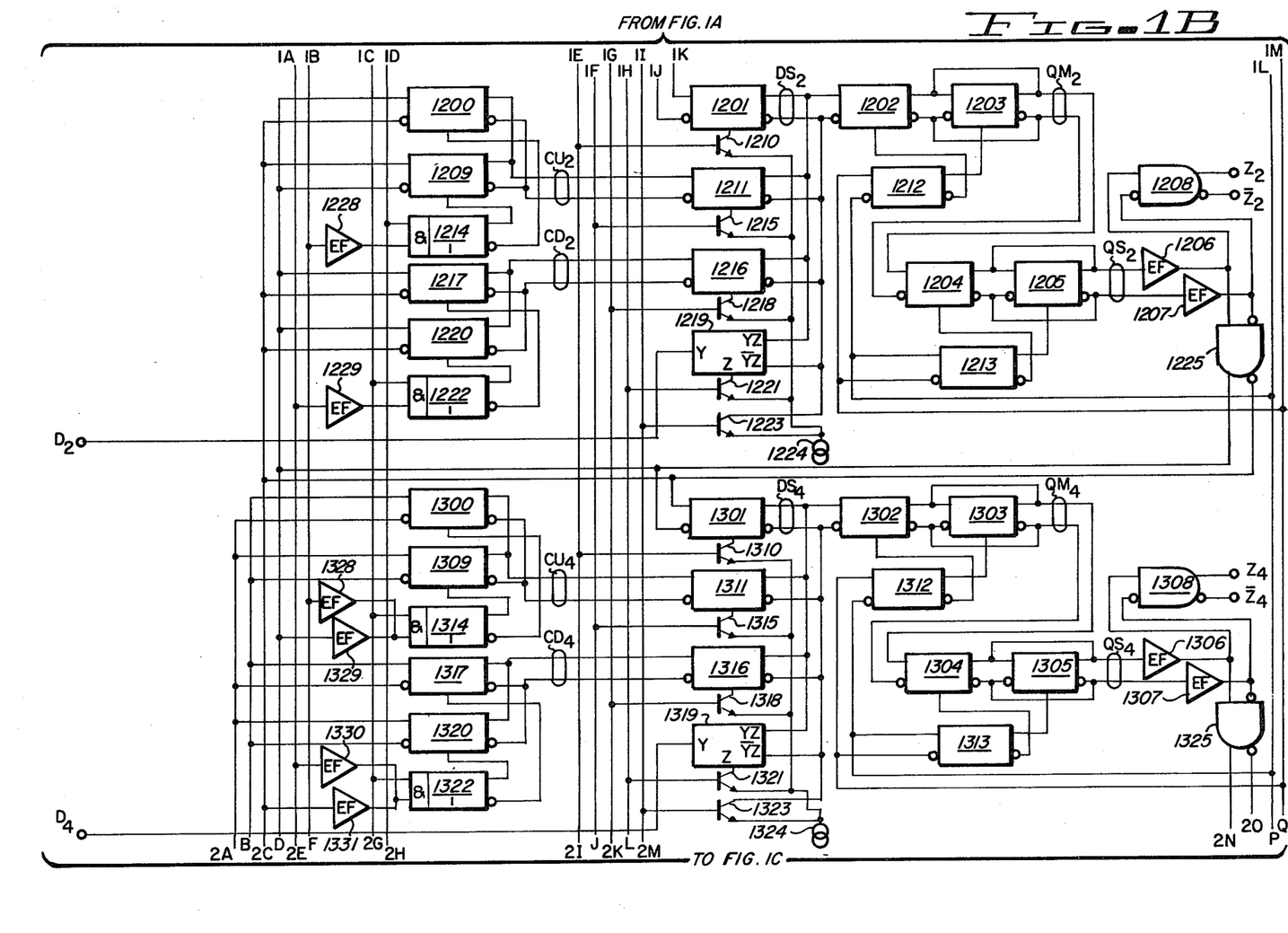
Figure 1C:
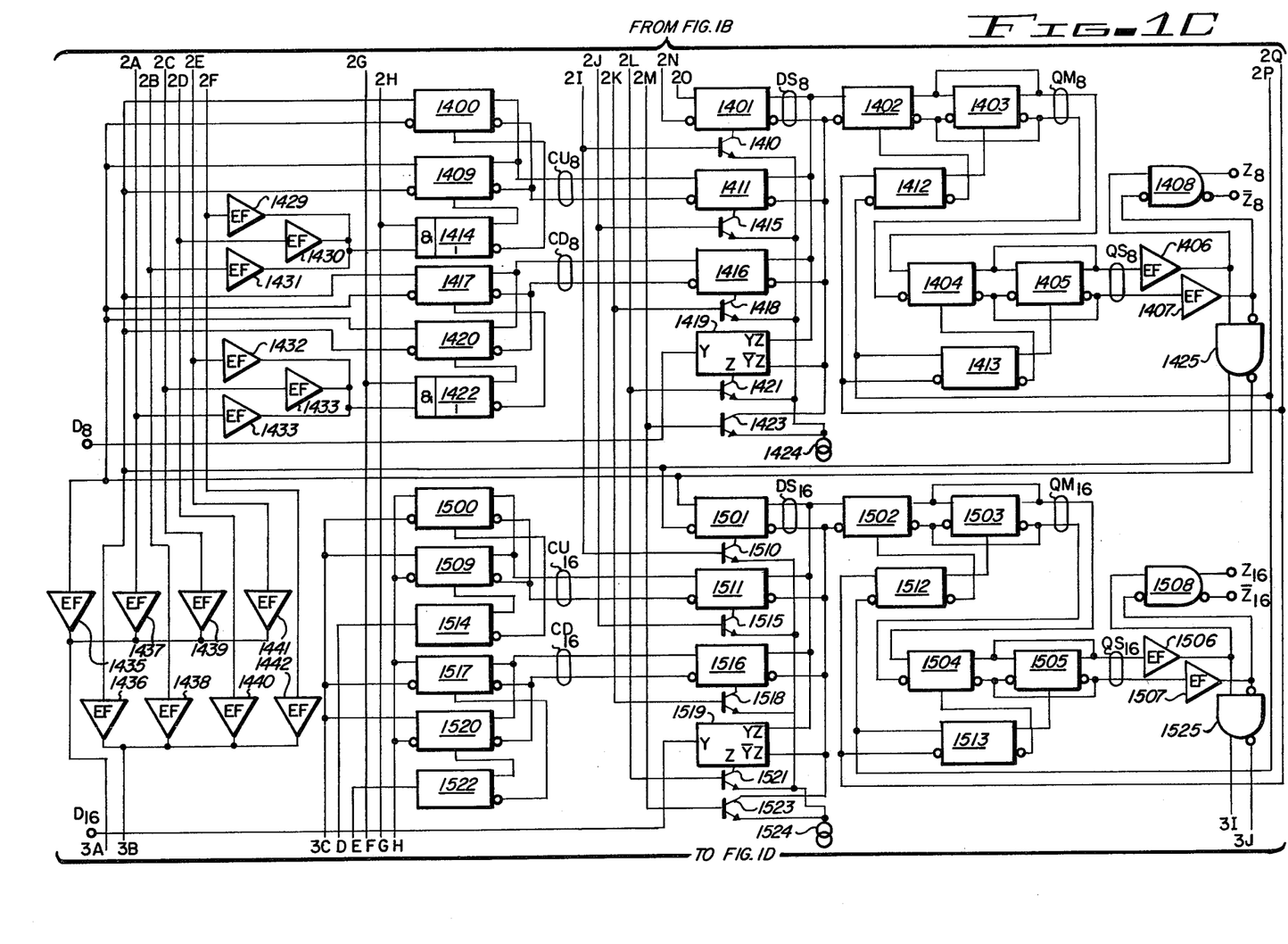

As shown on FIGS. 1B and 1C, subsequent data stages require that additional logic functions be performed prior to selection of either the $CU_{2i}$ or $CD_{2i}$ data inputs. These additional logic operations are shown in FIGS. 1B and 1C and are set forth specifically in the list of logic equations supra. In addition, the equation for the selection of the $DS_{2i}$ data inputs are given in that list of logic equations.

Having explained how data is selected for presentation to the master/slave latch arrangement, a detailed description of the operation of that latch is now in order. Whenever the master/slave latch clock, $\$.QM¢\$$, is a logical "0," differential upper level gates 1102 and 1105 are enabled by differential lower level gates 1112 and 1113 respectively. So as long as the clock remains in the logical "0" state, any input change in $DS_1$ will cause a corresponding data change at $QM_1$, whereas the slave latch output at $QS_1$ is isolated from any such changes by differential upper level gate 1104, which being disabled, prevents data changes at $QM_1$ from being transmitted to $QS_1$. On the falling edge of the clock, i.e., $\$.QM¢\$$, goes from a logical "0" to a logical "1," gates 1102 and 1105 are disabled and gates 1103 and 1104 are enabled causing the data at $QM_1$ to appear at $QS_1$ and at the same time isolating the master latch from data changes at $DS_1$ by the now disabled differential upper level gate 1102. The slave latch output, $QS_1$, is buffered by emitter followers 1106 and 1107 and at the same time shifted $-0.8$ VDC. The outputs of emitter followers 1106 and 1107 is then used as an input to differential output buffer 1108, which provides a single-ended output signal $Z_1$ and its complement $\overline{Z}_1$ which utilizes a 0.5 VDC voltage swing to transmit a logical "0" and a logical "1" information. The voltage translation prevents the base of either transistor in gate 1108 from reaching 0.0 VDC to eliminate potential saturation of the output transistors. The outputs of emitter followers 1106 and 1107 are also used as inputs to differential output buffer 1125. Gate 1125 has had its output resistors selected to cause a 0.5 VDC difference between the true output and its complement. In this manner the outputs of gate 1125 may be used in differential mode. The output of gate 1125 is connected to the NFT selection gates of the succeeding state in such a manner as to present the complement of the $QS_1$ output so that an inversion occurs between each bit when the counter is operating in the serial shift (NFT) register mode. It is also an input to the first and subsequent data stages for implementation of the $CU_{2(i-1)}$ and $CD_{2(i-1)}$ logic equations.

Figure 1D:
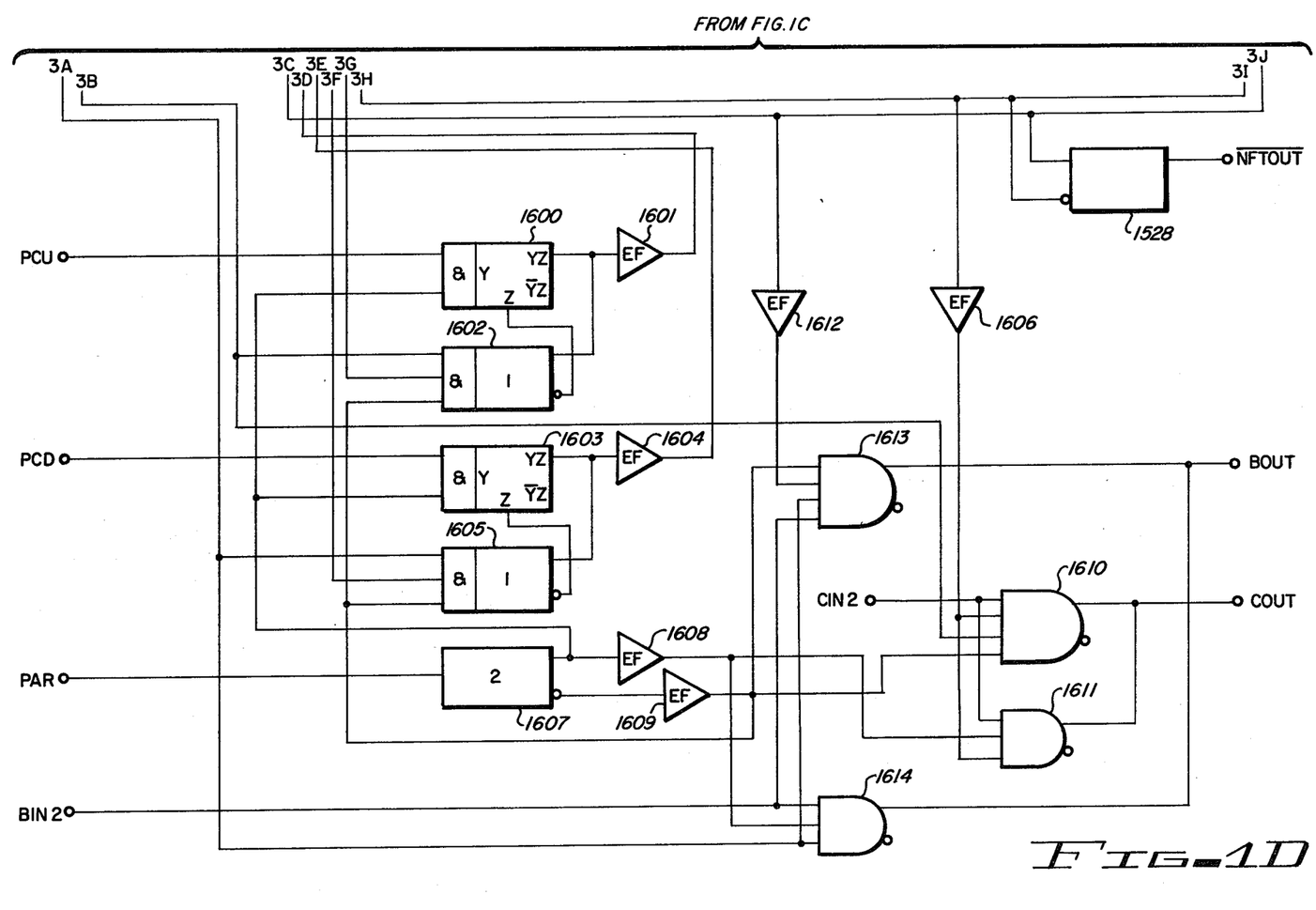
Figures 2, 3:
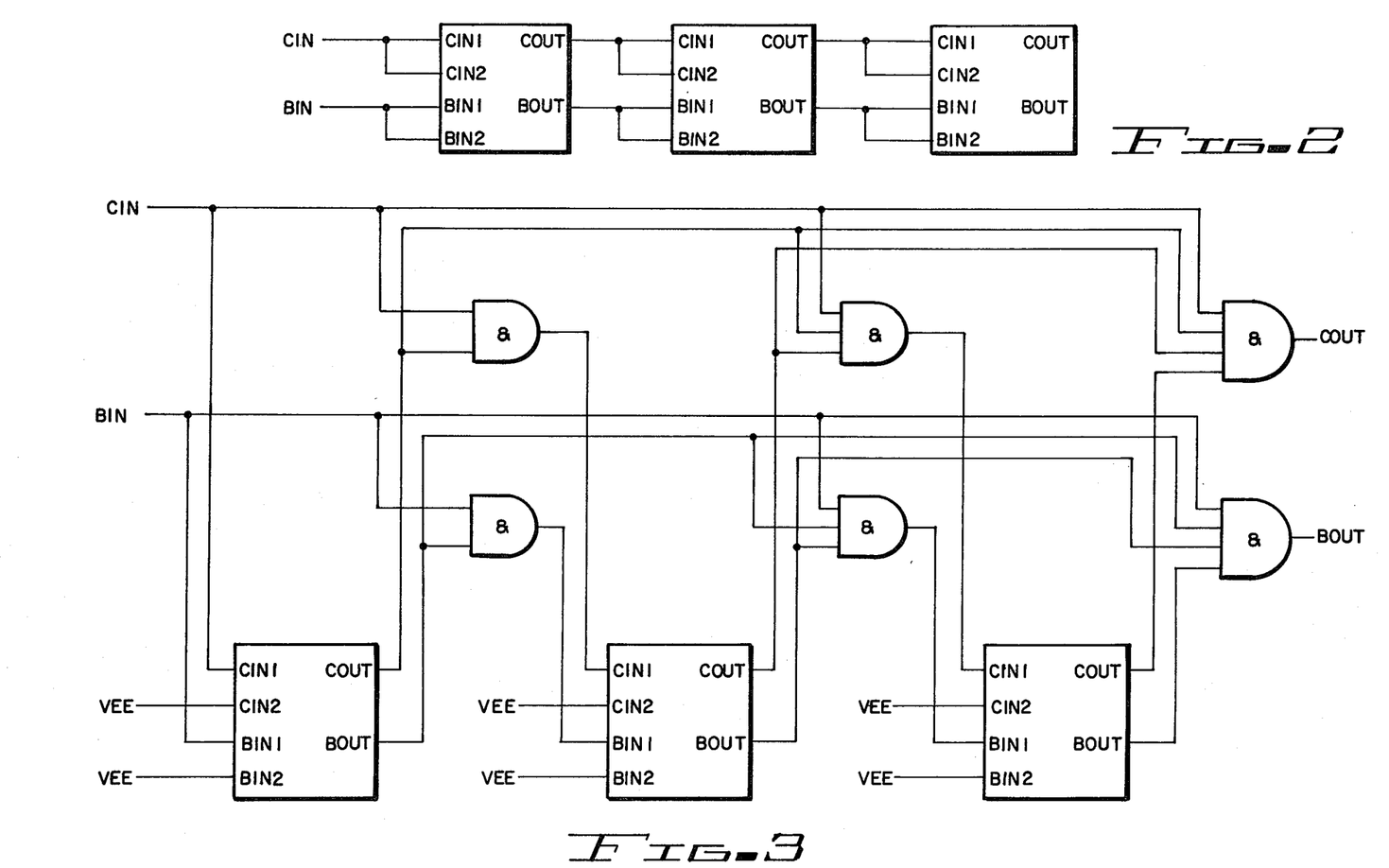
FIG. 2 is a block diagram of the instant invention when multiple counter/registers are implemented to form a ripple counter.
FIG. 3 is a block diagram in which the instant invention is utilized for a Carry-Look-Ahead/Borrow-Look-Ahead counter.
Figure 4:
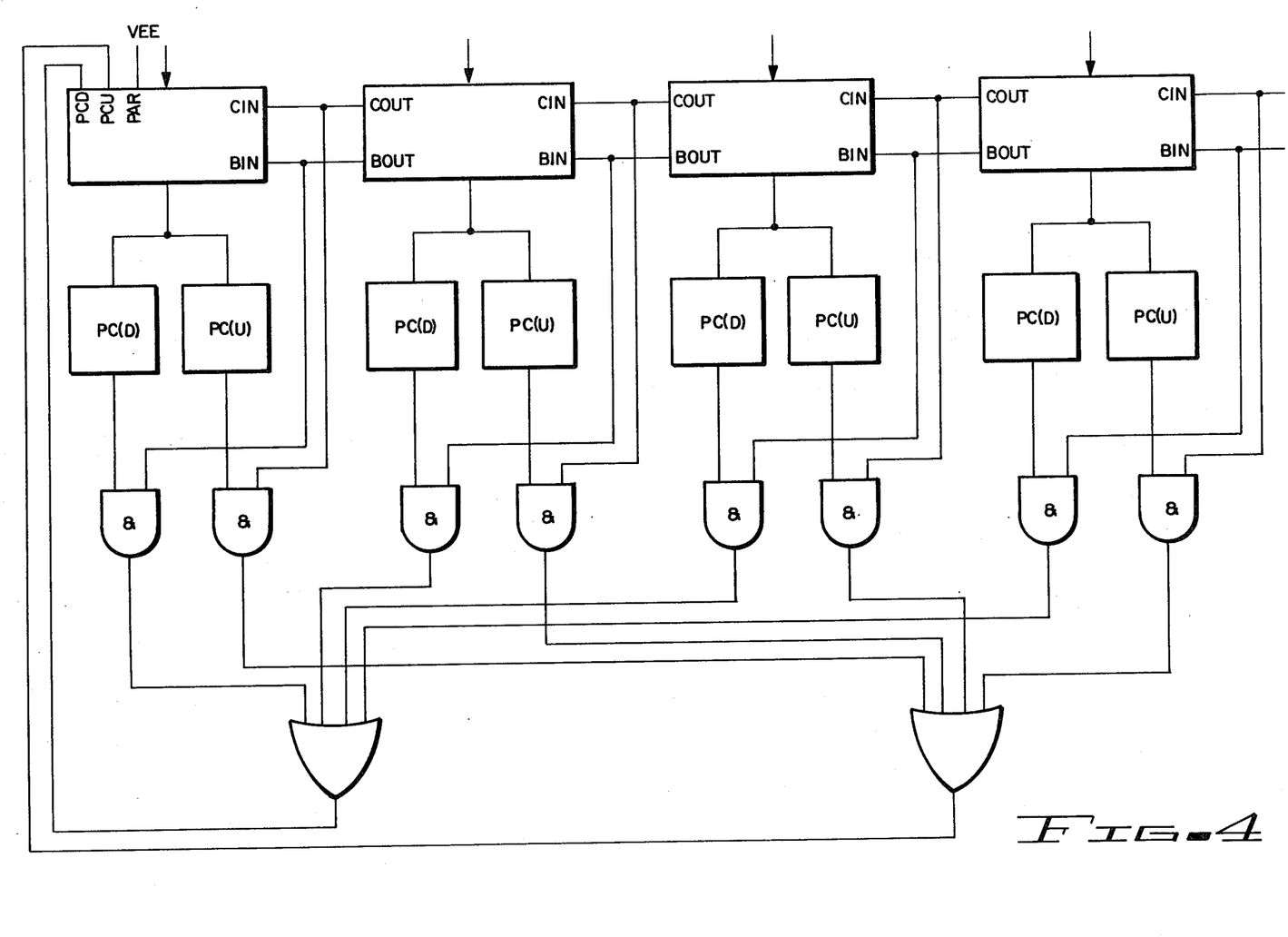
FIG. 4 is a block diagram representing the application of the counter when the parity prediction circuitry is used.

The parity section shown in FIG. 1D provides for control of the last data stage enabling it to act either as a data bit or a parity bit depending on the state of the PAR input. In order for the parity section to control the fifth data stage as a parity bit, it is necessary that PCU and PCD inputs conform to the logic equations shown supra. An application of the counter utilizing the parity section is shown in FIG. 4, wherein a 19-bit plus parity up-down counter with ripple carry and borrow is depicted. Use of the counter as a straight ripple counter with no parity checking is depicted in FIG. 2, whereas FIG. 3 is an illustration of use of the counter register with external logic to allow carry-look-ahead and borrow-look-ahead trees which is extremely useful on long counters where a high count rate is required.

While the principles of the instant invention have now been made clear in an illustrative embodiment, there will be many modifications to the structure, arrangement, proportion, elements, material, and components that are obvious to those skilled in the art without departing from those principles. The appended claims are therefore intended to cover and embrace any such modifications within the limits of the true scope and spirit of the invention.

What is claimed is:

1. A plural bit, D-type master/slave up-down counter/shift register with reset, load, and parity check capabilities, comprising:
    a plurality of data stages;
    a parity section coupled to the last of said plurality of data stages for enabling said last data stage to act as a parity bit;
    a control section coupled to each of said plurality of data stages for providing control signals to each of said stages; and
    a clocking section, coupled to each of said plurality of data stages for providing clock signals thereto, each of said data stages further comprising:
        an input section;
        a master/slave latch section responsive to said input section;
        a buffered output section coupled to said master/slave latch section; and
        a count control section responsive to the output of said buffered output section for providing count-up and count-down control signals.

2. The plural bit, D-type master/slave up-down counter/shift register as recited in claim 1, wherein said parity section further comprises:
    parity means responsive to a PCU (parity count-up), a PCD (parity count-down), and PAR (parity) signal, said parity means enabling the last of said plurality of data stages to act as a parity bit when said PAR signal is a logical "1" and as a data bit when said PAR signal is a logical "0."

3. The plural bit, D-type master/slave up-down counter/shift register as recited in claim 1, wherein said control section further comprises:
    control means responsive to a LOAD, a DOWN, an UP, a NFTS shift, and a NFTR reset signal, said control means connected to each of said plurality of data stages for providing control signals to each of said input sections and each of said master/slave latch sections of each of said plurality of data stages.

4. The plural bit, D-type master/slave up-down counter/shift register as recited in claim 3, wherein said clocking section further includes:
    clock means responsive to clock control signal ¢$, said NFTR signal and said NFTS signal for providing clock signal to said master/slave latch section in each of said plurality of data stages.

5. The plural bit, D-type master/slave up-down counter/shift register as recited in claim 4, wherein said master/slave latch further comprises:
    a first, a second, a third, and a fourth differential upper level gate, a first differential lower gate, and a second differential lower level gate;
    said first differential upper level gate responsive to the output of said input section;
    said first and said second differential lower level gate responsive to said clock signals from said clocking section;
    said first and said second differential upper level gates responsive to said first differential lower level gate
    said third and fourth differential upper level gate responsive to said second differential lower level gate;
    first means for connecting the output of said first differential upper level gate to the input and output of said second differential upper level gate and the input of said third differential upper level gate;
    second means for connecting the output of said third differential upper level gate to the input and output of said fourth differential upper level gate.

6. The plural bit, D-type master/slave up-down counter/shift register as recited in claim 5, wherein said buffered output section further comprises:
    a first and a second emitter follower connected to the output of said fourth differential upper level gate;
    a first and a second differential output buffer connected to the output of said first and second emitter followers, said first differential output buffer providing a single-ended output and its complement with a 0.5 VDC swing, said second differential output buffer providing a differential signal to each of said count control sections.

7. The plural bit, D-type master/slave up-down counter/shift register as recited in claim 3, wherein said count control section further comprises:

count selection means responsive to a CINI (carry-in) signal, a BINI (borrow-in) signal, and the output of said buffered output section for providing a CU (count-up) signal and a CD (count-down) signal, said count selection means also responsive to the output of each of said buffered output sections in each preceding data stage of said plurality of data stages.

8. The plural bit, D-type master/slave up-down counter/shift register as recited in claim 5, wherein said input section further comprises:

data selection means, responsive to said control means and a D (data) signal, said data selection means connected to said count control section for providing a data input to said master/slave latch said data input being:

equal to said CU signal when said UP signal is a logical "1,"

equal to said CD signal when said DOWN signal is a logical "1;"

equal to said D signal when said LOAD signal is a logical "1;"

equal to a logical "0" when said NFTR is a logical "1" and said NFTS is a logical "0;"

equal to a $\overline{\text{NFTIN}}$ signal when said NFTS signal is a logical "1" and said input section is in the first of said plurality of data stages; and, equal to the complement of the output of the master/slave latch of the preceding one of said plurality of data stages when said input section is not in said first of said plurality of data stages.

* * * * *